(12) United States Patent
Nakano et al.

(10) Patent No.: US 6,471,524 B1
(45) Date of Patent: Oct. 29, 2002

(54) IC SOCKET

(75) Inventors: Tomohiro Nakano, Fujisawa; Akira Kaneshige, Kanagawa; Kiyoshi Adachi, Hiratsuku, all of (JP)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 09/578,651

(22) Filed: May 25, 2000

(30) Foreign Application Priority Data

May 25, 1999 (JP) .......................................... 11-145183

(51) Int. Cl.[7] .............................................. H01R 12/00
(52) U.S. Cl. ............................ 439/70; 439/71; 439/66
(58) Field of Search ............................. 439/65, 66, 70, 439/71, 73, 74, 264, 268, 331, 591

(56) References Cited

U.S. PATENT DOCUMENTS

| | | | |
|---|---|---|---|
| 4,161,346 A | * | 7/1979 | Cherian et al. ............... 439/66 |
| 4,773,877 A | | 9/1988 | Kriiger et al. |
| 5,320,559 A | | 6/1994 | Uratsuji et al. |
| 5,427,535 A | | 6/1995 | Sinclair |
| 5,641,945 A | | 6/1997 | Abe et al. |
| 5,685,725 A | | 11/1997 | Uratsuji |
| 5,702,255 A | * | 12/1997 | Murphy et al. ............... 439/74 |
| 5,727,954 A | | 3/1998 | Kato et al. |
| 5,800,184 A | * | 9/1998 | Lopergolo et al. ............ 439/66 |
| 5,877,554 A | | 3/1999 | Murphy |
| 5,921,786 A | | 7/1999 | Slocum et al. |
| 6,024,584 A | | 2/2000 | Lemke et al. |
| 6,033,233 A | * | 3/2000 | Haseyama et al. ............ 439/66 |
| 6,094,115 A | * | 7/2000 | Nguyen et al. ............... 439/66 |
| 6,102,709 A | * | 8/2000 | Howard et al. ............... 439/66 |
| 6,155,887 A | | 12/2000 | Cuff et al. |
| 6,190,181 B1 | * | 2/2001 | Affolter et al. ............... 439/70 |
| 6,193,524 B1 | | 2/2001 | Chang |

* cited by examiner

*Primary Examiner*—Tho D. Ta
(74) *Attorney, Agent, or Firm*—Thomas D. Paulius; Charles S. Cohen

(57) ABSTRACT

An IC socket has a socket body with a plurality of terminal mounting holes, and terminals of electrical connector mounted in the terminal mounting holes and each of the terminals of electrical connector having a contact portion, a spring portion and a tail portion for performing a burn-in test of an IC package by mounting the IC package on the socket body so as to place a solder ball as a contact of the IC package corresponding to the contact portion and contacting the contact portion with the solder ball. The spring portion of each of the terminals of electrical connector is formed into meandering shape as a whole by stacking a plurality of r-shaped portions in series with alternately orienting each r-surface thereof in the opposite direction from the contact portion toward the tail portion. The contact portion of each of the terminals of electrical connector has a pair of contact pieces on both sides of a recess portion, and horizontal stepped portions projected from opposite sides at generally intermediate portion of generally V-shaped portion formed by oblique contact end faces of the pair of contact pieces and formed with edged portions at the tip end thereof, the lower portion of the solder ball being supported in contact by the horizontal stepped portions and the edge portions.

17 Claims, 8 Drawing Sheets

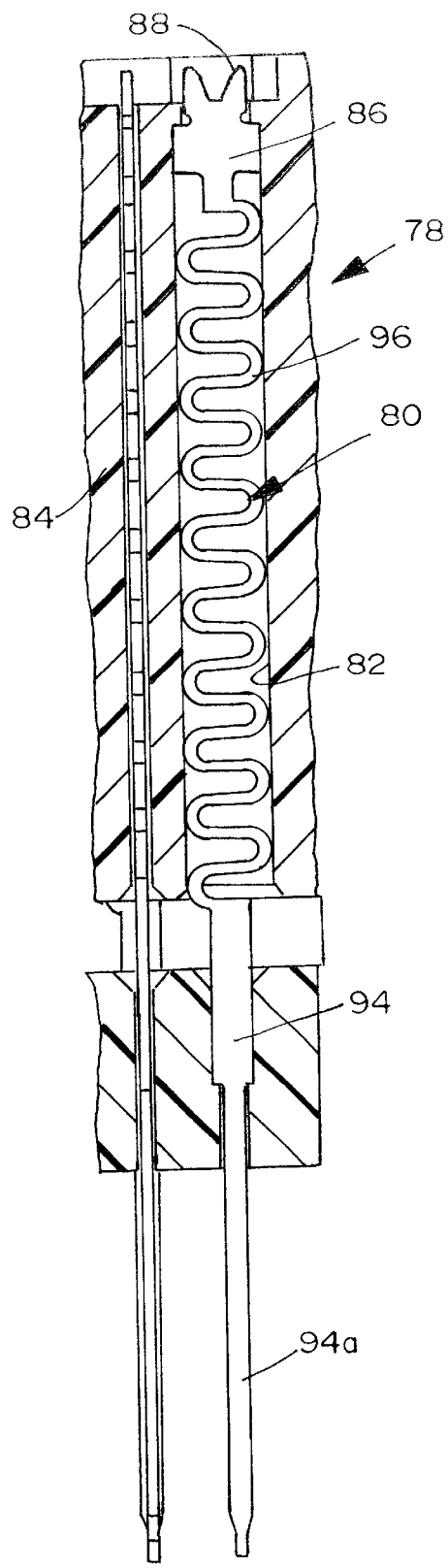
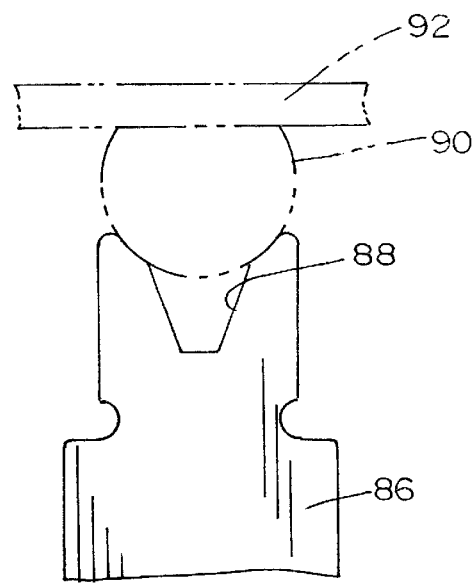
FIG. 17
(PRIOR ART)
FIG. 16
(PRIOR ART)

IC SOCKET

FIELD OF THE INVENTION

This invention generally relates to the art of IC sockets and, particularly, to a terminal for use in such sockets, the terminal having different spring sections with different resiliencies. However, this concept is equally applicable for other types of electrical connecting devices.

BACKGROUND OF THE INVENTION

An IC socket is used for performing burn-in tests of IC packages. In other words, an IC package is tested for a given number of hours at given, sometimes elevated temperatures to ensure that the IC package will not fail during normal operation. Such an IC socket typically includes a dielectric socket body or housing which mounts a plurality of terminals in respective terminal-receiving passages in the body. First contact ends of the terminals receive respective solder balls of a ball grid array of the IC package, for instance. The opposite ends of the terminals have tails which abuttingly engage circuit traces on a printed circuit board. Spring portions typically are provided intermediate the opposite contact ends of the terminals for applying linear contact pressure at the interconnections with the solder balls and the printed circuit board. A typical burn-in socket is shown in Japanese Unexamined Patent Publication No. HEISEI 6-203926 which shows terminals that have resiliently deformable linear spring strips. Another example is disclosed in Japanese Unexamined Patent Publication No. HEISEI 8-88063.

One of the problems in using spring-loaded terminals of the character described above is that compromises must be made in the amount of resiliency built into the terminals and yet have the terminals perform their intended purposes. In particular, high contact forces are desirable for applying pressures between the tail portions of the terminals and the circuit conductors on the printed circuit board to ensure good electrical contacts at these points. However, at the opposite ends of the terminals, lower contact forces are more desirable to ensure that the terminal contact ends do not damage the solder balls of the IC package. Consequently, compromises continuously are made in efforts to achieve sufficient contact forces at the tail ends of the terminals without damaging the solder balls at the opposite ends of the terminals. The present invention is directed to solving this problem by providing unique terminal configurations which are capable of applying different contact forces at opposite ends of the terminals.

SUMMARY OF THE INVENTION

An object, therefore, of the present invention is to provide an IC socket or other electrical connecting device with new and improved terminal configurations.

In the exemplary embodiment of the invention, an IC socket includes a dielectric socket body having a plurality of elongated terminal-receiving passages. A plurality of elongated terminals are received in the passages. At least some of the terminals each includes first and second opposite contact ends for longitudinal pressure engagement with appropriate contacts of a pair of electrical devices. A retention section is disposed intermediate the opposite contacts ends for fixing the terminal in its respective passage. A first spring section is disposed between the retention section and the first contact end. A second spring section is disposed between the retention section and the second contact end. The first and second spring sections are provided with different resiliencies for applying different contact pressures at the first and second contact ends, respectively.

As disclosed herein, the first and second spring sections are elongated and have sinuous configurations. The first and second spring sections generally have the same cross-dimensions. However, one spring section is longer than the other spring section to provide greater resiliency and, thereby, less contact pressure at the respective contact end of the terminal.

The IC socket is disclosed herein with a plurality of terminals having first contact ends recessed for receiving solder balls of an IC package. The second contact ends are in the form of tail portions for engaging circuit conductors on a printed circuit board. The first spring sections for the first contact ends at the solder balls have more resiliency than the second spring sections for the second contact ends at the printed circuit board. Therefore, greater contact forces are applied to the circuit conductors on the board than are applied to the solder balls.

Another feature of the invention is the construction of the socket body to include at least two parts on opposite sides of the retention sections of the terminals to sandwich the retention sections therebetween. The terminal-receiving passages extend through both body parts.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 16 is a view similar to that of FIG. 8, but showing a pair of terminals according to the prior art; and FIG. 17 is an enlarged, fragmented elevational view of the top contact end of the prior art terminal of FIG. 16.

DETAILED DESCRIPTION OF THE PREFERRED EMBODIMENT

Figure 1:
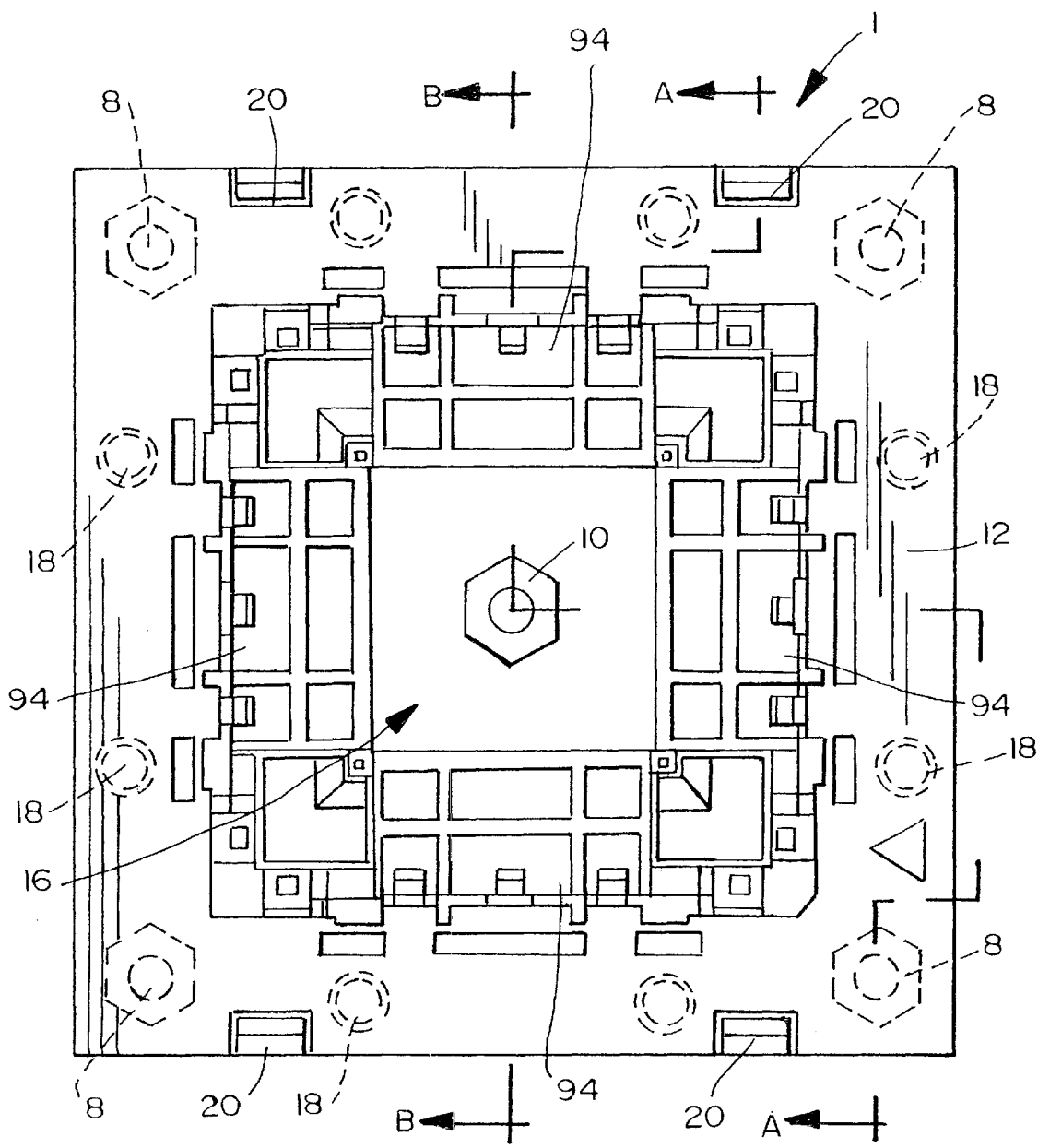
FIG. 1 is a top plan view of an IC socket embodying the concepts of the invention.
Figure 2:
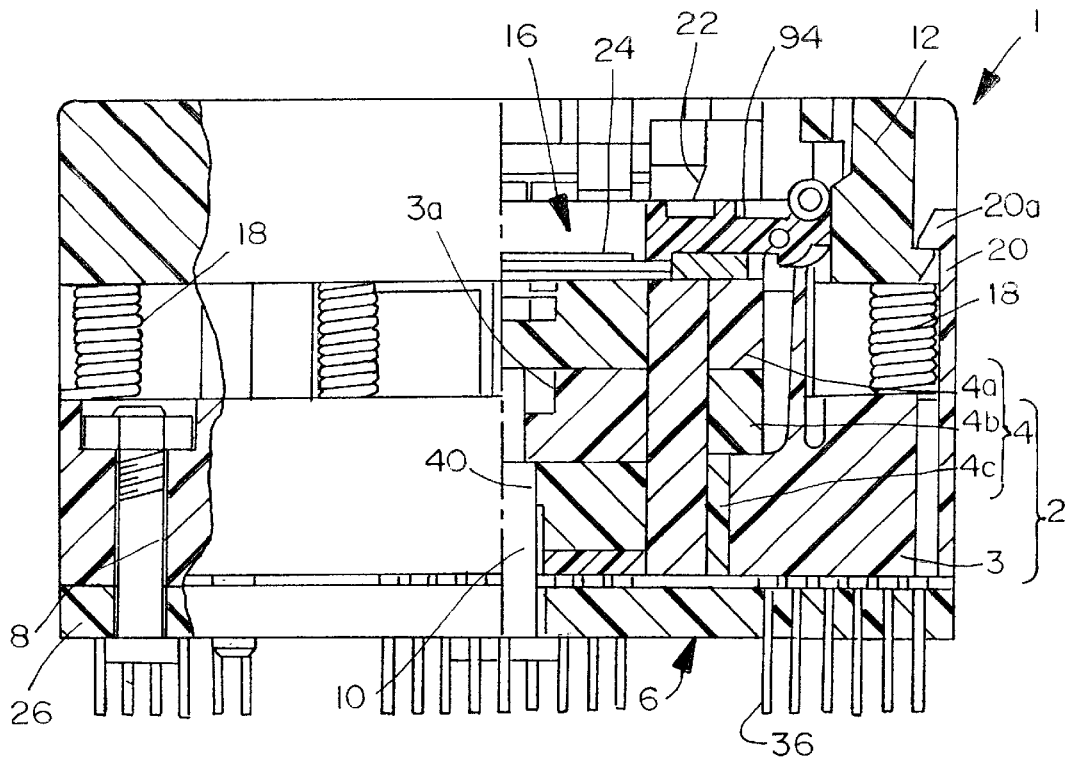
FIG. 2 is a fragmented vertical section taken generally along line A—A of FIG. 1, showing an IC package in a burn-in test phase.
Figure 3:
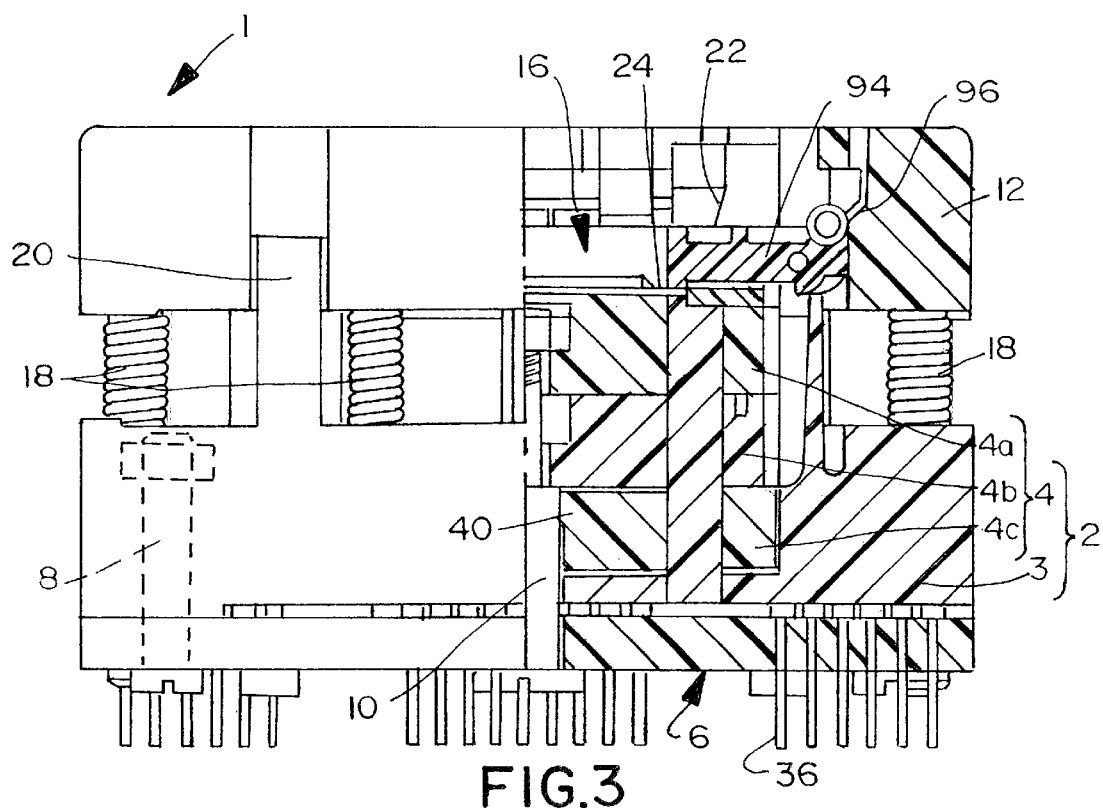
FIG. 3 is a fragmented vertical section taken generally along line B—B of FIG. 1, showing the IC package in the burn-in test phase.
Figure 4:
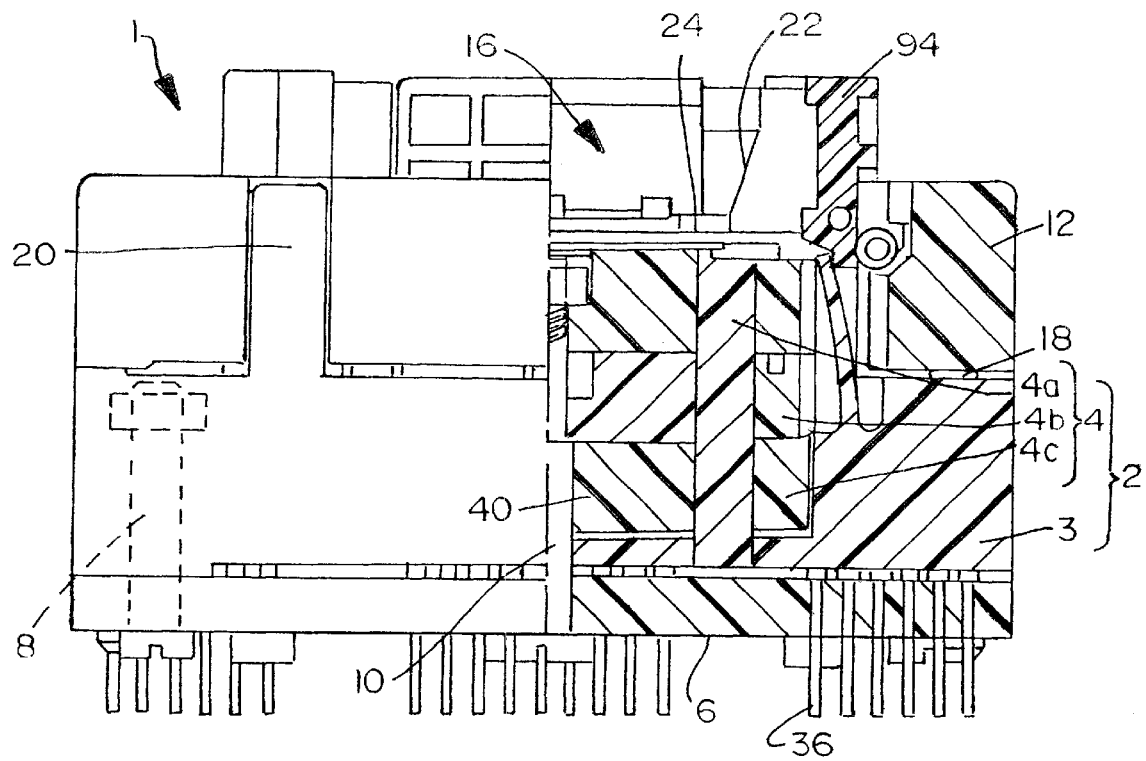
FIG. 4 is a view similar to that of FIG. 3, but with the IC package about to be removed after its burn-in test.

Referring to the drawings in greater detail, and first to FIGS. 1–4, an IC socket for performing bum-in tests as described in the "Background", above, is generally designated 1. The socket includes a socket body 2 which is an assembly formed of an outer cup-shaped housing defining a rectangular central opening 3a and an inner housing 4 received in the center opening. Inner housing 4 actually is formed by three rectangular housing segments 4a, 4b and 4c which are stacked within center opening 3a of the outer housing.

A printed circuit board, generally designated 6, is fixed by four bolts 8 to the lower surface of outer housing 3. Housing segments 4a, 4b and 4c are fixed within center opening 3a in outer housing 3 by a stepped bolt 10. The stepped bolt extends upwardly through printed circuit board 6 and into outer housing 3.

A cover 12 is positioned onto a top surface 14 of outer housing 3. The cover has a square center opening, generally designated 16, and is biased upwardly by eight coil springs 18 sandwiched between the cover and the outer housing. The cover is held down onto the outer housing by the engagement of hooks 20a of a plurality of engagement pieces 20 fixed to two opposite sides of outer housing 3. Therefore, cover 12 is resiliently held on top of the housing and can be depressed against the biasing of springs 18, while hooks 20a of engagement pieces 20 limit movement of the cover away from the housing.

Center opening 3a of outer housing 3 is provided with tapered guiding surfaces 22 at the four corners of the opening for guiding the corners of a rectangular IC package 24 into the opening.

Figure 7:
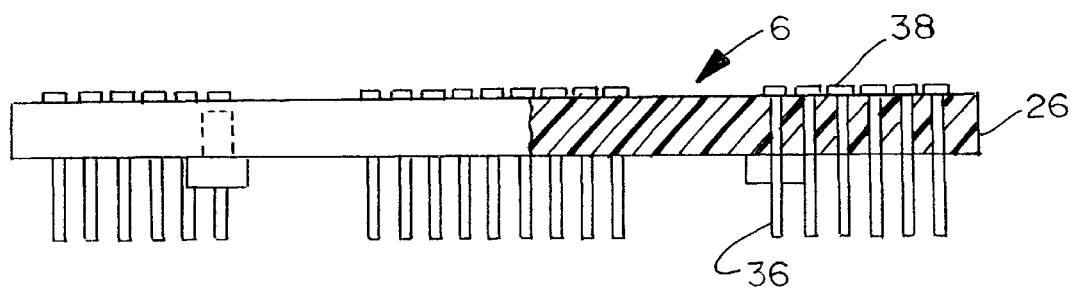
FIG. 7 is a side elevational view, partially in section, of the printed circuit board of FIG. 5.
Figure 5:
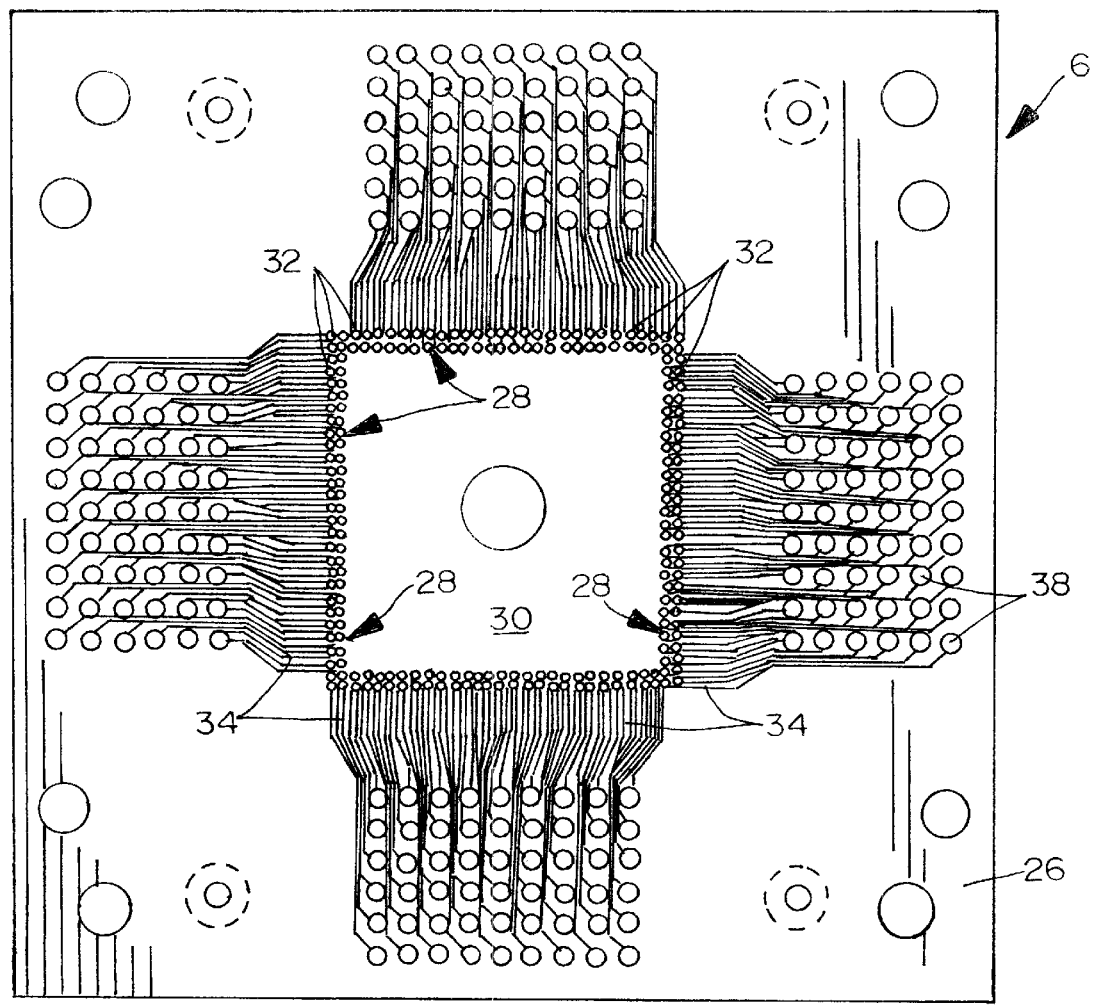
FIG. 5 is a top plan view of the bottom printed circuit board shown in FIGS. 1–4.
Figure 6:
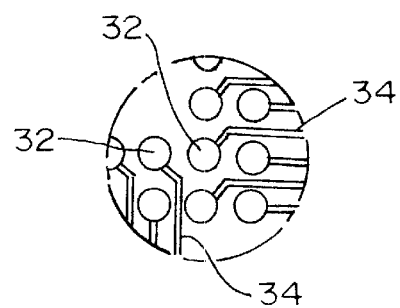
FIG. 6 is an enlarged isolated view of some of the circuit conductors on the printed circuit board of FIG. 5.

Referring to FIGS. 5–7, printed circuit board 6 includes a generally square substrate 26. A plurality of contact pads, generally designated 28 (FIG. 5), are arranged in a square array about an open area 30. The contact pads are at a fine pitch and high density. For instance, there may be 216 total contact pads, with 54 contact pads along each side of the square array. FIG. 6 shows that contact pad arrays 28 actually include a plurality of closely spaced contact pads 32 joined by printed circuits or lead lines 34 which radiate outwardly to a plurality of contact pins 36 (FIG. 7) which have head portions 38 connected to circuit lines 34.

Figure 8:
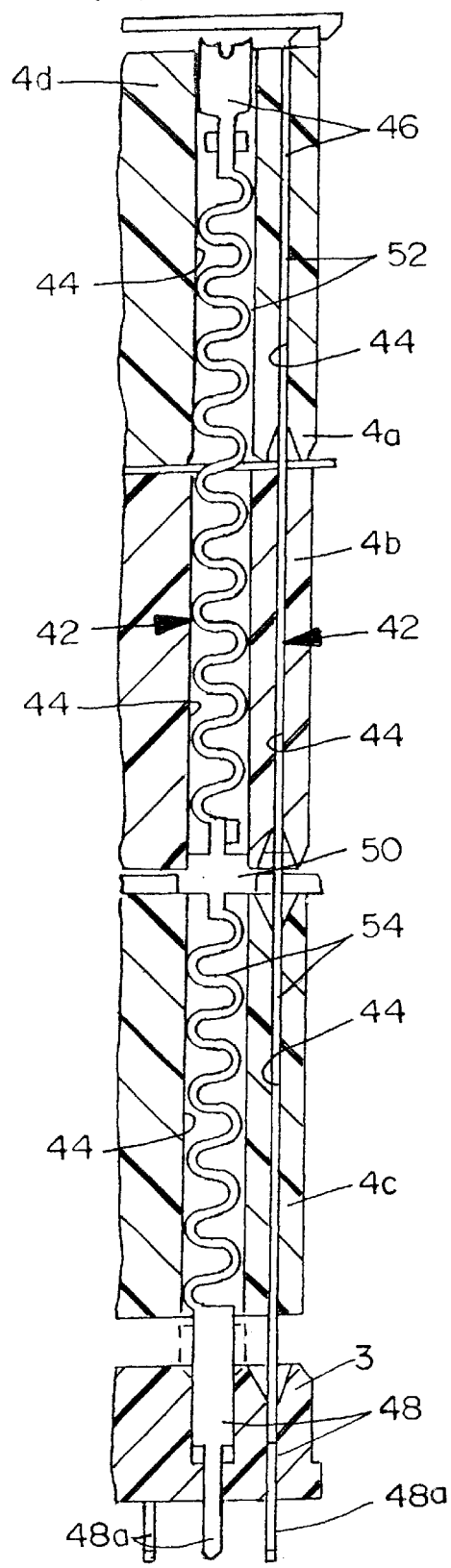
FIG. 8 is an enlarged, fragmented vertical section through a portion of the IC socket to show one of the terminals in a no-load condition.
Figure 11:
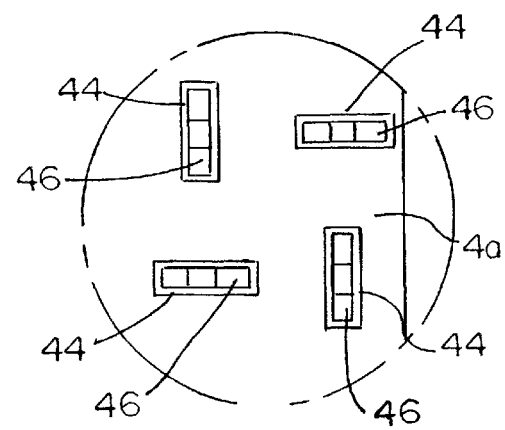
FIG. 11 is an enlarged plan view of an isolated cluster of terminal-receiving passages and terminals, looking generally in the direction of line C—C of FIG. 10.

Referring back to FIGS. 2–4, a terminal area, generally designated 40, is shown somewhat schematically by phantom/solid line cross-hatching, because the details would be too fine to show in those figures. Suffice it to say, it can be seen that the terminal areas are generally along each edge of housing segments 4a, 4b and 4c of inner housing 4. More particularly, referring to FIGS. 8, 10 and 11, a plurality of terminals, generally designated 42, are mounted in a respective plurality of terminal-receiving passages 44 which extend in aligning fashion through the stacked inner housing segments 4a, 4b and 4c. It can be seen in FIG. 11 that the terminal-receiving passages and respective terminals are in alternating perpendicular orientations about the four edges of the stacked housing segments. As seen in FIG. 8, the terminal-receiving passages are open at the top of upper housing segment 4a and at the bottom of lower housing segment 4c.

Figure 13:
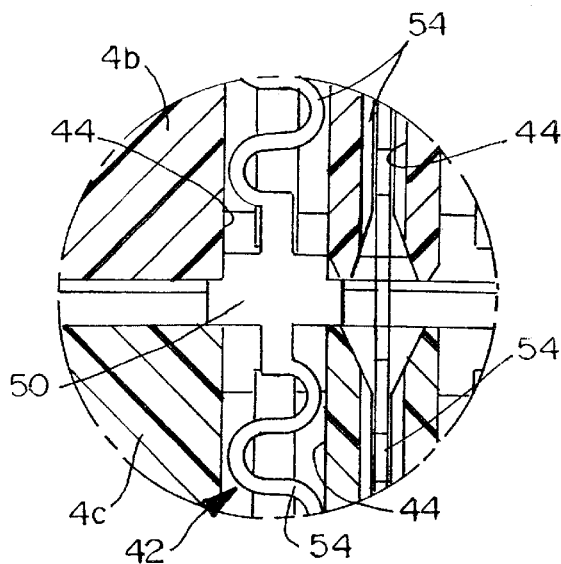
FIG. 13 is an enlarged isolated section of the area of the retention section of one of the terminals.

Referring specifically to FIG. 8, each terminal 42 includes a first or top contact end 46 and a second or bottom contact end 48 terminating in a tail portion 48a. Each terminal end 48 includes an enlarged intermediate retention section 50 for fixing the terminal in its respective passage 44, as described below. Each terminal includes a first or top spring section 52 which extends between retention section 50 and top contact end 46. IA second or bottom spring section 54 extends between retention section 50 and bottom contact section 48/48a. Each terminal is stamped or blanked from conductive sheet metal material, and it can be seen that spring sections 52 and 54 are stamped in a sinuous or wave-spring configuration. The spring sections generally have the same cross-dimensions, but it can be seen that top spring section 52 is longer than bottom spring section 54. Therefore, the top spring section is more resilient that the bottom spring section and, as a result, the top spring section will exert a lower longitudinal force toward top contact end 46 than the forces applied by the bottom spring section toward bottom contact end 48. Referring to FIG. 13 in conjunction with FIG. 8, it can be seen that retention section 50 of each terminal 42 is enlarged laterally to define a pair of outwardly projecting flanges 50a which are sandwiched between housing segments 4b and 4c of inner housing 4. This fixes terminals within their respective terminal-receiving passages 44 in the housing segments.

Figure 10:
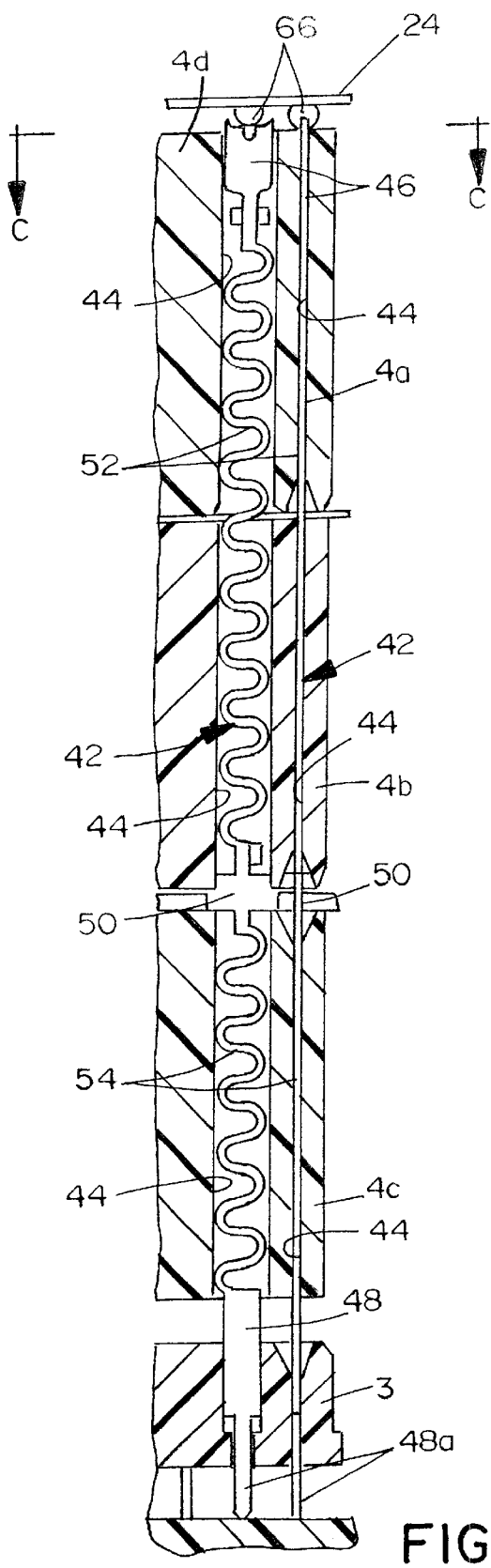
FIG. 10 is a view similar to that of FIG. 8, but with the terminal in a spring-loaded condition between the IC package and the printed circuit board.
Figure 9:
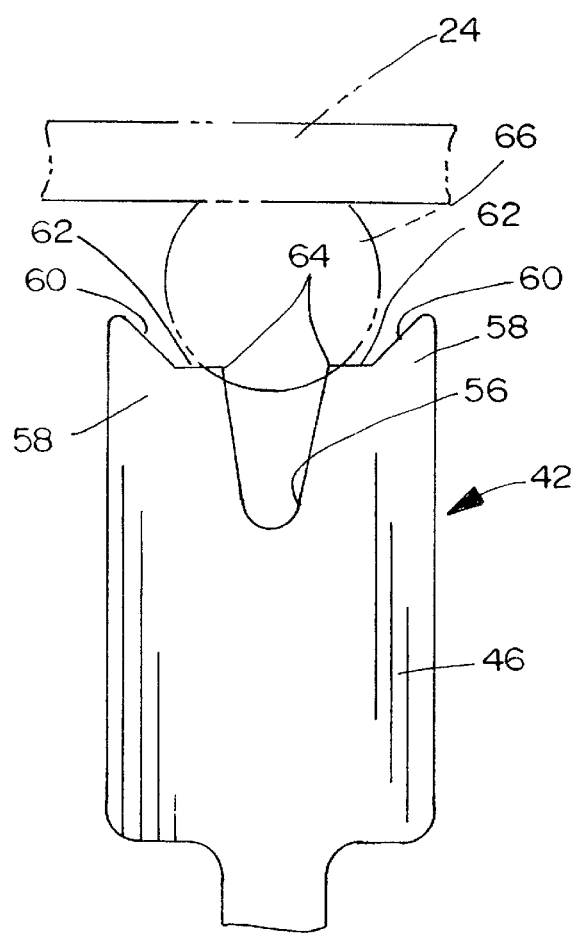
FIG. 9 is a fragmented elevational view of the top contact end of the terminal which engages one of the solder balls of the IC package.

Referring to FIGS. 9 and 10 in conjunction with FIG. 8, top contact end 46 of each terminal 42 is bifurcated at the distal end thereof to form a recessed area 56 between a pair of symmetrical contact portions 58. The contact portions have oblique faces 60 which extend to horizontal stepped faces 62 which, in turn, terminate at pointed edges 64. The pointed edges of each contact end 46 engage a respective one of a plurality of solder balls 66 of IC package 24 as seen clearly in FIGS. 9 and 10.

Figure 12:
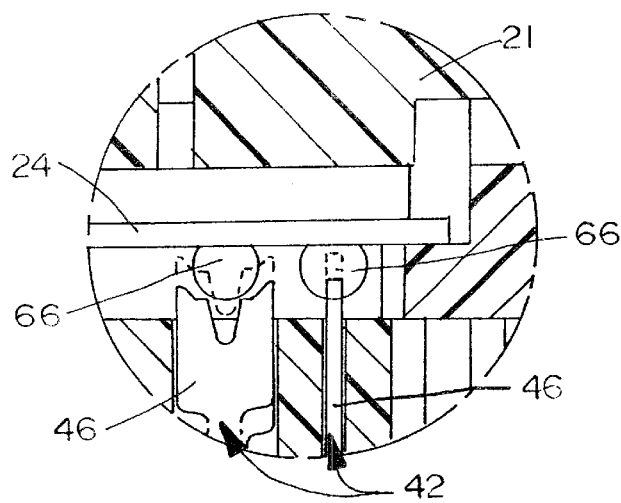
FIG. 12 is a fragmented, isolated section showing the yielding of the terminals under the pressures applied by the solder balls of the IC package.
Figure 15:
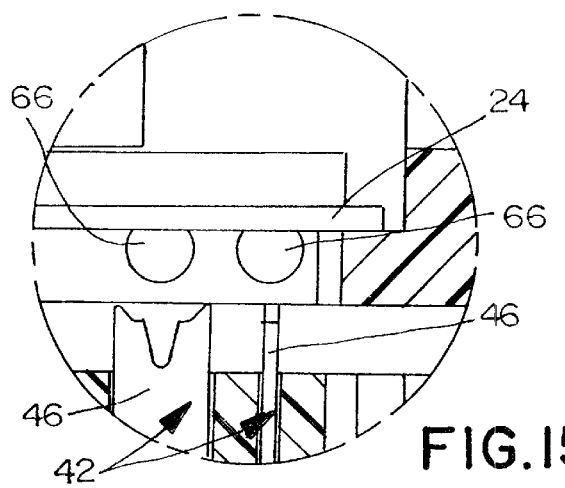
FIG. 15 is a view similar to that of FIG. 12, but with the solder balls spaced away from the terminals.

FIG. 12 shows top contact ends 46 of a pair of terminals 42 yielding under the pressure of engagement with a pair of solder balls 66 of IC package 24. In essence, the top contact ends yield against the biasing of top spring section 52. FIG. 15 shows the condition of top contact ends 46 when IC package 24 and solder balls 66 are removed from engagement with the contact ends.

Figure 14:
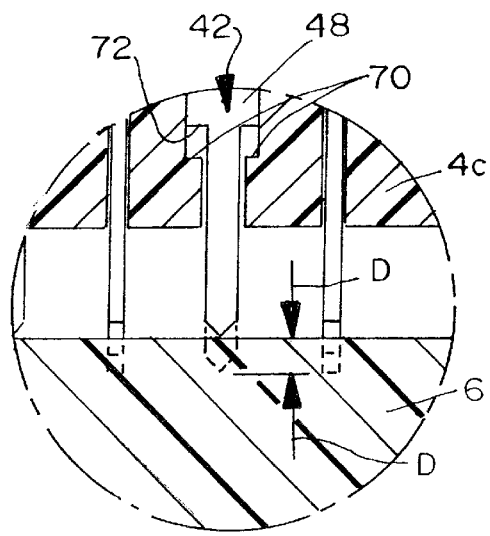
FIG. 14 is a view similar to that of FIG. 12, but of the opposite ends of the terminals at the printed circuit board.

Referring to FIG. 14 in conjunction with FIGS. 8 and 10, bottom contact end 48 and tail portion 48a of each terminal 42 engages one of the contact pads 32 (FIG. 6) on printed circuit board 6. The tails are compressed against the biasing forces of bottom spring sections 54 as indicated by arrows "D" (FIG. 14). With the bottom spring section being shorter, stiffer and less resilient than top spring section 52, these contact forces are greater than the contact forces applied to the solder balls of the IC package, as described above. FIG. 14 also shows that bottom housing segment 4c has stop shoulders 70 for engaging stop shoulders 72 stamped on the terminals to define the outer limit of extension of tail portions 48a beyond bottom housing segment 4c.

Finally, FIGS. 16 and 17 show a terminal configuration, generally designated 78, according to the prior art.

Specifically, a plurality of terminals, generally designated 80, are mounted in a corresponding plurality of terminal-receiving passages 82 in a housing 84. Each terminal includes a top contact end 86 having a recessed area 88 for engaging a solder ball 90 of an IC package 92. Each terminal includes a bottom contact end 94 having a tail portion 94a for engaging a circuit conductor on a printed circuit board (not shown). A single sinuous Spring section 96 extends continuously between top contact section 86 and bottom contact section 94. Therefore, the same contact forces will be applied by top contact section 86 against solder ball 90 of IC package 92 as bottom contact section 94 will apply to the printed circuit board. Consequently, compromises must be made, resulting a lesser than desired force on the printed circuit board and a greater than desired force on the solder ball of the IC package. The dual spring terminals of the invention herein solves this problem and does not require any such compromises.

In assembly of IC socket 1, stepped bolt 10 (FIGS. 2–4) is inserted through printed circuit board 6 and upwardly through housing segments 4a, 4b and 4c and then fastened by a nut (not shown). Similarly, the four bolts 8 are inserted through the printed circuit board to fix the board to the bottom of outer housing 3. Cover 12 then is mounted by the support of coil springs 18 and is held by engagement of hooks 20a of engaging pieces 20. A pivotally opening and closing holder 94 is located at four positions at each peripheral edge of rectangular center opening 16 of cover 12 to hold IC package 24 within the cover. Holders 94 pivot about pins 96.

Consequently, clamping printed circuit board 6 against the bottom of outer housing 3 causes longitudinal forces to be applied to bottom contact ends 48 and tail portions 48a of terminals 42. Mounting IC package 24 within cover 12 and clamping the cover onto the housing by engaging pieces 20 against springs 18, causes solder balls 66 to apply contact forces to top contact ends 46 of the terminals. With the different resiliencies of spring sections 52 and 54, different forces are exerted on the printed circuit board and the solder balls, as described above. For instance, it has been found that the top spring section can exert a lesser contact force of $10gf$ whereas the bottom spring section can apply a greater contact force of $20gf$.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An IC socket, comprising:
    a dielectric socket body including a plurality of elongated terminal-receiving passages; and
    a plurality of elongated terminals received in the passages, at least some of the terminals each including
        first and second opposite contact ends for longitudinal pressure engagement with appropriate contacts of a pair of electrical devices,
        a retention section intermediate the opposite contact ends for fixing the terminal in its respective passage,
        a first spring section between the retention section and the first contact end,
        a second spring section between the retention section and the second contact end, and
        said second spring section is less resilient than said first spring section and applies a greater contact pressure to said second contact end than said first spring section applies to said first contact end.

2. The IC socket of claim 1 wherein said first and second spring sections generally have the same configurations and cross-dimensions, with one spring section being longer than the other spring section.

3. The IC socket of claim 1 wherein said first contact end is recessed for receiving a solder ball of an IC package, and said first spring section has more resiliency than the second spring section.

4. The IC socket of claim 1 wherein said second contact end comprises a tail for engaging a circuit conductor of a printed circuit board, and said second spring section has less resiliency than the first spring section.

5. The IC socket of claim 1 wherein said socket body includes at least two parts on opposite sides of said retention sections of the terminals to sandwich the retention sections therebetween, with the terminal-receiving passages extending through both body parts.

6. The IC socket of claim 1 wherein said first and second spring sections are elongated and have sinuous configurations.

7. The IC socket of claim 6 wherein said first and second spring sections generally have the same configurations and cross-dimensions, with one spring section being longer than the other spring section.

8. An IC socket, comprising:
    a dielectric socket body including a plurality of elongated terminal-receiving passages; and
    a plurality of elongated terminals received in the passages, at least some of the terminals including
        a first contact end for engaging a solder ball of an IC package;
        a second contact end in the form of a tail for engaging a circuit conductor of a printed circuit board,
        a retention section intermediate the opposite contact ends for fixing the terminal in its respective passage, the retention section being fixed with respect to the socket body and the first and second contact ends,
        a first spring section between the retention section and the first contact end, said first spring section applies a first contact pressure to the solder ball of the IC package,
        a second spring section between the retention section and the second contact end, said second spring section applies a second contact pressure to the circuit conductor of the printed circuit board, and
        said first spring section has greater resiliency than said second spring section and its said first contact pressure is less than said second contact pressure of said second spring section.

9. The IC socket of claim 8 wherein said first and second spring sections generally have the same configurations and cross-dimensions, with the first spring section being longer than the second spring section.

10. The IC socket of claim 8 wherein said socket body includes at least two parts on opposite sides of said retention sections of the terminals to sandwich the retention sections therebetween, with the terminal-receiving passages extending through both body parts.

11. The IC socket of claim 8 wherein said first and second spring sections are elongated and have sinuous configurations.

12. The IC socket of claim 11 wherein said first and second spring sections generally have the same configurations and cross-dimensions, with the first spring section being longer than the second spring section.

13. An electrical connector, comprising:
a dielectric housing having a plurality of terminal-receiving passages; and
a plurality of terminals received in the passages, at least one of the terminals including
   first and second opposite contact ends for pressure engagement with appropriate contacts of a pair of electrical devices,
   a retention section intermediate the opposite contact ends for fixing the terminal in its respective passage,
   a first spring section between the retention section and the first contact section, said first spring section having a given stiffness, and
   a second spring section between the retention section and the second contact section, said second spring section having a stiffness different from said given stiffness.

14. The electrical connector of claim 13 wherein said first and second spring sections generally have the same configurations and cross-dimensions, with one spring section being longer than the other spring section.

15. The electrical connector of claim 13 wherein said housing includes at least two parts on opposite sides of said retention section and sandwiching the retention section therebetween, with the terminal-receiving passages extending through both housing parts.

16. The electrical connector of claim 13 wherein said first and second spring sections are elongated and have sinuous configurations.

17. The electrical connector of claim 16 wherein said first and second spring sections generally have the same configurations and cross-dimensions, with one spring section being longer than the other spring section.

* * * * *